United States Patent [19]

Benoit-Gonin et al.

[11] 4,350,976
[45] Sep. 21, 1982

[54] CHARGE-TRANSFER CODED-VOLTAGE GENERATOR FOR USE IN ANALOG-DIGITAL CODERS AND DECODERS

[75] Inventors: Roger Benoit-Gonin; Jean L. Berger; Jean L. Coutures, all of Paris, France

[73] Assignee: Thomson-CSF, Paris, France

[21] Appl. No.: 215,134

[22] Filed: Dec. 10, 1980

[30] Foreign Application Priority Data

Dec. 27, 1979 [FR] France .................. 79 31801

[51] Int. Cl.³ ............................................. H03K 13/02
[52] U.S. Cl. ............... 340/347 DA; 340/347 AD; 364/862; 357/24
[58] Field of Search ............... 340/347 AD, 347 DA, 340/347 M; 364/862; 307/221 D; 357/24

[56] References Cited

U.S. PATENT DOCUMENTS

| | | | |
|---|---|---|---|
| 3,836,906 | 9/1974 | Ando | 340/347 DA |
| 3,906,488 | 9/1975 | Suarez-Gartner | 340/347 AD |
| 4,087,812 | 5/1978 | Terman | 340/347 DA |
| 4,099,175 | 7/1978 | Rubin | 340/347 DA |
| 4,145,689 | 3/1979 | Butler | 340/347 AD |
| 4,164,734 | 8/1979 | Jensen | 340/347 AD |
| 4,206,446 | 6/1980 | Rockett | 340/347 AD |
| 4,213,120 | 7/1980 | Buchanan | 340/347 DA |
| 4,306,221 | 12/1981 | Jiang | 340/347 AD |

FOREIGN PATENT DOCUMENTS 2336834  7/1977  France .

Primary Examiner—Charles D. Miller
Attorney, Agent, or Firm—Roland Plottel

[57] ABSTRACT

Successive two-trip traversals of charges between gates $G_0$ and $G_2$ make it possible to obtain beneath gates $G_1$ and $G_2$ quantities of charges equal to $Q_R$, $Q_R/2$, $Q_R/2^2$ ... $Q_R/2^i$. A readout device for reading charges and connected to gates $G_2$ and $G_4$ generates voltages $V_R$ and $V_{Ri} = a_0 \cdot V_R + a_1 \cdot V_R/2 + \ldots + a_{i-1} \cdot V_R/2^{i-1} + V_R/2^i$ which are compared with a voltage sample $V_x$ to be coded in order to determine by successive approximations the coefficients $a_0 \ldots a_n$ which are equal to 0 or to 1 such that $V_x = a_0 \cdot V_R + a_1 \cdot V_R/2 + \ldots + a_n \cdot V_R/2^n$. Depending on the value of $a_i$, each quantity of charges $Q_R/2^i$ stored beneath gate $G_1$ is removed beneath diode $D_e$ or stored beneath gate $G_3$ and then transferred beneath gate $G_4$.

9 Claims, 5 Drawing Figures

CHARGE-TRANSFER CODED-VOLTAGE GENERATOR FOR USE IN ANALOG-DIGITAL CODERS AND DECODERS

This invention relates to charge-transfer coded-voltage generators which are used in analog-digital coders and decoders.

A well-known practice in the prior art consists in determining by successive approximations the coefficients $a_0, a_1 \ldots a_i \ldots a_n$ which are equal to 0 or to 1 and make it possible to write an unknown voltage $V_x$ in the form:

$$V_x = a_0 \cdot V_R + a_1 \cdot V_R/2 + a_2 \cdot V_R/2^2 + \ldots + a_i \cdot V_R/2^i + \ldots + a_n \cdot V_R/2^n,$$

where $V_R$ is a reference voltage.

To this end, $V_x$ is first compared with $V_R$. If $V_x$ is smaller than $V_R$, then $a_0$ is accordingly equal to 0 whereas $a_0$ is otherwise equal to 1;

$V_x$ is then compared with $V_{R1} = a_0 V_R + V_R/2$. If $V_x$ is smaller than $V_{R1}$, then $a_1$ is in that case equal to 0 but is otherwise equal to 1;

$V_x$ is then compared with $V_{R2} = a_0 V_R + a_1 \cdot V_R/2 + V_R/4$.

If $V_x$ is smaller than $V_{R2}$, then $a_2$ is in that case equal to 0 but otherwise equal to 1;

and so on until all the coefficients $a_0 \ldots a_n$ have been determined.

It can therefore be noted that, in order to determine the coefficients by successive approximations, it is necessary to utilize voltages $V_R$ and $$V_{Ri} = a_0 V_R + a_1 \cdot V_R/2 + a_2 \cdot V_R/2^2 + \ldots + a_{i-1} \cdot V_R/2^{i-1} + V_R/2^i$$

with $i = 1 \ldots n$.

The voltages $V_R$ and $V_{Ri}$ can be generated by networks of resistors or capacitors whose values vary in powers of 2. This is the case, for example, in an article by Messrs. Mc Creary and Gray published in the IEEE Journal of Solid-State Circuits, volume SC 10, No. 6, December 1975, pages 371 to 385.

The aforementioned networks of resistors or capacitors often have the disadvantage of being cumbersome and lacking in accuracy. Moreover, in the case of some of these networks, it sometimes proves impossible during approximation to produce a value of $V_{Ri}$ directly from $V_{R(i-1)}$ and it is necessary to resume a new sequence of generation of voltages in order to obtain the correct value of $V_{Ri}$. Thus, in order to generate the n values of $V_{Ri}$ which are necessary for the determination of n coefficients, it may be necessary to carry out $n \cdot (n+1)$ voltage redistributions.

Moreover, French patent application No. 77,02067 published under U.S. Pat. No. 2,343,369 in the name of I.B.M. disclosed a device which utilizes the method of redistribution of charges; only n charge redistributions are necessary in order to determine the n coefficients.

Said device comprises a generator for producing quantities of charges $Q_R/2, Q_R/2^2 \ldots Q_R/2^n$. Two charge storage regions are provided:

one region in which the quantity of charges $Q_x$ corresponding to the unknown voltage $V_x$ is stored;

the other region which receives $Q_R/2$.

A comparison is made between $Q_x$ and $Q_R/2$:

if $Q_x > Q_R/2$, then $a_0 = 1$ and $Q_R/2^2$ is switched towards the region which contains $Q_R/2$;

if $Q_x < Q_R/2$, then $a_0 = 0$ and $Q_R/2^2$ is switched towards the region which contains $Q_x$; and so on until $a_n$ is obtained, each quantity of charges $Q_R/2^i$ being switched towards either one region or the other as a function of the value of $a_{i-1}$.

The coded-voltage generator in accordance with the present invention also utilizes the method of charge redistribution but its structure is completely different from that of the known device described in the foregoing.

The generator in accordance with the invention has all the advantages of the device described earlier from the point of view of small overall size and speed in particular. Moreover, the generator provides a higher degree of precision than said device.

In said device, the quantities of charges $Q_R/2, Q_R/2^2 \ldots Q_R/2^n$ are obtained (as shown in FIGS. 3 to 5) by making use of two storage electrodes separated by a transfer electrode. A quantity of charges $Q_R$ is stored beneath one of the storage electrodes. Redistribution of charges beneath the two storage electrodes followed by separation of the charges by the transfer electrode makes it possible to obtain $Q_R/2$ beneath each storage electrode. The charges beneath one of the storage electrodes are removed and the next step consists in carrying out a redistribution followed by a separation which makes it possible to obtain $Q_R/4$, and so on.

Distribution of charges at the time of division by 2 is carried out in a more random manner than in our invention and a lower degree of accuracy is therefore achieved.

The coded-voltage generator in accordance with the invention makes it possible to produce:

either the voltages $V_R$, $V_{Ri} = a_0 V_R + a_1 \cdot V_R/2 + a_2 V_R/2^2 + \ldots + a_{i-1} \cdot V_R/2^{i-1} + V_R/2^i$ with $i = 1 \ldots n$, in the case in which an unknown voltage $V_x$ is available and in which it is desired to determine by successive approximations, by comparing $V_R$ and $V_{Ri}$ with $V_x$, the coefficients $a_0 \ldots a_n$ which are equal to 0 or to 1 and such that $V_x = a_0 V_R + a_1 V_R/2 + \ldots + a_i V_R/2^i + \ldots + a_n \cdot V_R/2^n$;

or the voltage $V_x = a_0 V_R + a_1 \cdot V_R/2 + \ldots + a_i V_R/2^i \ldots + a_n \cdot V_R/2^n$, in the case in which the coefficients $a_0 \ldots a_n$ are known and in which $V_x$ is not available.

The generator in accordance with the invention is constituted by a charge-transfer device comprising an alternate arrangement of storage gates and transfer gates together with:

a diode $D_e$ placed at one end of the active zone in which transfer and storage of charges takes place, the function of said diode being to inject a reference quantity of charges $2Q_R$ at the beginning of processing of each sample $V_x$ or of each series $a_0 \ldots a_n$ as well as to effect removal of surplus charges during the processing operation;

an insulating diffusion which divides into two equal parts the charges originating from a storage gate $G_o$ located near the diode $D_e$ and which divides the active zone after $G_o$ into two parallel channels;

in one channel, a storage gate $G_2$ beneath which the quantities of charges $Q_R, Q_R/2, \ldots Q_R/2^i \ldots$ are stored by successive two-trip traversals between $G_o$, $G_2$;

in the other channel, three storage gates $G_1$, $G_3$ and $G_4$, the quantity of charges $Q_R/2^i$ stored beneath the gate $G_1$ and originating from the gate $G_o$ being transferred beneath said gate $G_o$ and then removed beneath the diode $D_e$ when $a_i$ is zero in respect of $i=0 \ldots n$ and being transferred beneath the gate $G_3$ when $a_i$ is equal to 1;

when the coefficients $a_o \ldots a_n$ are unknown, a charge-reading device connected to gates $G_2$ and $G_4$ and adapted to generate the reference voltage $V_R$ at the time of transfer of the quantity of charges $Q_R$ beneath the gate $G_2$, thus permitting determination of $a_o$ by comparison of the voltage $V_R$ with the voltage $V_x$, then to generate $V_{R1} = a_o V_R + V_R/2$ at the time of transfer of the quantity $Q_R/2$ beneath the gate $G_2$ and, in the event that $a_o = 1$, at the time of transfer of $Q_R$ originating from gate $G_3$ to the gate $G_4$, thus permitting determination of $a_1$ by comparison of the voltage $V_{R1}$ with the voltage $V_x$, and so on until generation of $V_{Rn}$ and determination of $a_n$, or, when the coefficients $a_o \ldots a_n$ are known, a charge-reading device connected to the gate $G_4$ for generating the voltage $V_x$ by transfer of charges from gate $G_3$ to gate $G_4$ when the n coefficients of $V_x$ have been processed.

Moreoever, in a preferred embodiment of the generator in accordance with the invention, in the case in which the voltage $V_x$ is available and in which the coefficients $a_o \ldots a_n$ are unknown, it is possible to dispense with any need for an external source of reference voltage by converting the voltage $V_x$ to be coded to a quantity of charges $Q_x$ by means of a charge injection device which is identical with the device employed for generating $2Q_R$. Reading of the voltage $Q_x$ is then carried out so as to obtain a voltage $V_{Lx}$ by means of a device which is identical with the device employed for reading the charges beneath the gates $G_2$ and $G_4$. The advantage of conversion followed by reading of $Q_x$ lies in comparison of the signals $V_{Lx}$ and $V_{Ri}$ having the same direct-current component and the same scale of amplitude.

The advantage offered by the generator in accordance with the invention lies in the fact that it can be employed in analog-digital coders or decoders as described in an article by Messrs. Gray and Hodges entitled "All MOS analogic-digital conversion techniques" and published in "IEEE Transactions on circuits and systems," volume CAS-25, No. 7, July 78, pages 482 to 489.

These and other features of the invention will be more apparent to those skilled in the art upon consideration of the following description and accompanying drawings, wherein:

In the different figures, the same references designate the same elements but the dimensions and proportions of the different elements have not been observed for the sake of enhanced clarity.

FIG. 1 shows a top view of the charge-transfer device which constitutes the generator in accordance with the invention and the circuit diagram of the device which is constituted by MOS transistors, capacitors and resistors and which is associated to the charge-transfer device.

Figure 1:
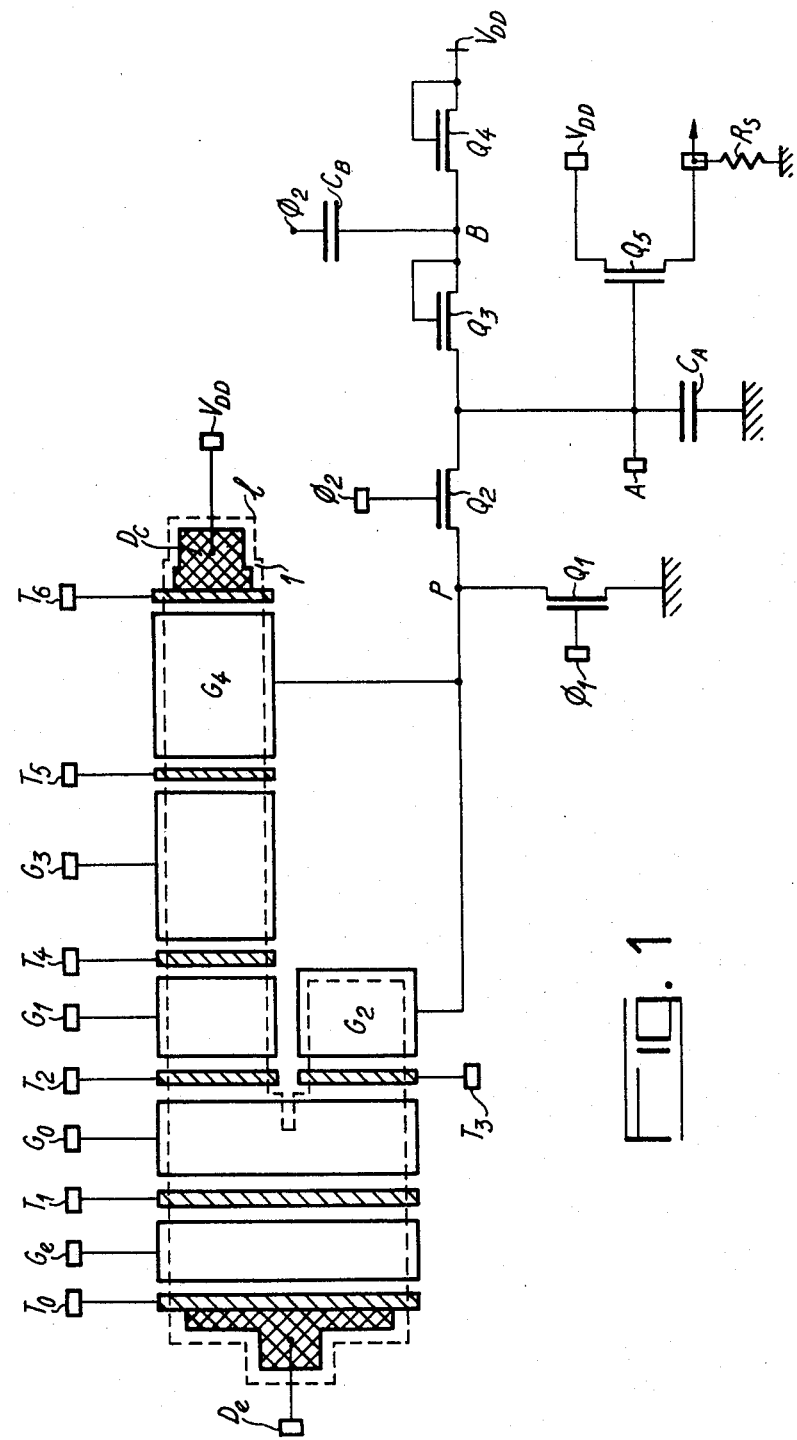
FIG. 1 is a top view of the charge-transfer device constituting the generator in accordance with the invention and the circuit diagram of the device consisting of MOS transistors, capacitors and resistors which is associated to the charge-transfer device.

Said charge-transfer device is preferentially of the type known as a charge-coupled device (CCD).

Charge transfer can be carried out either at the surface or in volume.

The active region of the semiconductor substrate in which transfer and storage of charges take place is located within the dashed outline 1. Outside the region defined by said outline, overdoping of the substrate has the effect of raising the inversion threshold and thus prevents any storage of charges.

At one end of the active zone, namely the end corresponding to the left-hand side of the figure, provision is made for a diode $D_e$ which serves to introduce a reference charge $2Q_R$ beneath a storage gate $G_e$ by means of a transfer gate $T_o$. The diode $D_e$ and the gates $T_o$ and $G_e$ constitute the device for injecting the reference charge $2Q_R$ within the generator.

The diode $D_e$ is also employed for removal of surplus charges during operation of the generator.

The gate $G_e$ is followed by a transfer gate $T_1$ and by a storage gate $G_o$.

Beneath the gate $G_o$, an insulating diffusion extends to one-half of the width of the active charge-transfer region in order to effect a pre-division of the charge stored beneath the gate $G_o$ into two equal quantities of charges. This insulating diffusion divides the active region downstream of the gate $G_o$ into two parallel channels which usually have the same width. Thus two quantities of charges equal to one-half of the charge stored beneath the gate $G_o$ will be transferred beneath the storage gates $G_1$ and $G_2$ which are located in each channel downstream of the gate $G_o$ and separated from this latter by the transfer gates $T_2$ and $T_3$. This division of a quantity of charges by a diffused region is already known in the prior art.

One of the channels therefore terminates in the storage gate $G_2$ whilst the other channel is provided downstream of the storage gate $G_1$ with two storage gates $G_3$ and $G_4$ and three transfer gates, namely the transfer gate $T_4$ between the storage gates $G_1$ and $G_3$, the transfer gate $T_5$ between the storage gates $G_3$ and $G_4$, and the transfer gate $T_6$ between the storage gate $G_4$ and a collecting diode $D_c$. The collecting diode $D_c$ which terminates the channel is connected to a direct-current voltage $V_{DD}$ and permits removal of the charges at the end of processing of a sample $V_x$ or of a series $a_o \ldots a_n$.

Depending on whether $V_x$ or coefficients $a_o \ldots a_n$ are available, the gates $G_2$ and $G_4$ or the gate $G_4$ alone are connected at a point P to a charge-reading device which serves to carry out nondestructive readout of the charges stored beneath the gates $G_2$ and $G_4$ or beneath the gate $G_4$ alone.

Said reading device can be a direct-current charge-reading device of a type already known in the prior art such as, for example, the device described in French patent application No. 77 13857 published under U.S. Pat. No. 2,389,899 in the name of Thomson-CSF.

The potential of the point P is maintained constant at the time of arrival of the charges by means of an MOS transistor $Q_2$ which is connected between the point P and a point A. The transistor $Q_2$ controlled by a periodic clock signal $\phi_2$ then becomes biased in the saturating mode. The current which passes through the transistor $Q_2$ at the time of inflow of charges is integrated within a capacitor $C_A$ connected between the point A and ground.

The voltage at the point A is read by an MOS transistor or TMOS $Q_5$ mounted as an emitter-follower, the gate of which is connected to the point A and one of the electrodes of which is connected to a voltage $V_{DD}$ whilst the other electrode delivers the read voltage to the terminals of a resistor $R_S$. The TMOS $Q_5$ can be replaced for reading the voltage at the point A by an operational amplifier having a gain of 1.

Between the point A and a point B, there is also connected a TMOS $Q_3$, the gate of which is connected to B. A capacitor $C_B$ is connected between the point B and the clock signal $\phi_2$. Finally, a TMOS $Q_4$ is connected between the point B and the voltage $V_{DD}$, the gate of the transistor $Q_4$ being also connected to $V_{DD}$.

Finally, depending on whether the voltage $V_x$ or the coefficients $a_0 \ldots a_n$ are available, a TMOS transistor $Q_1$ is connected between the gates $G_2$ and $G_4$ and ground or between the gate $G_2$ alone and ground. The TMOS transistor $Q_1$ is controlled by a periodic clock signal $\phi_1$ and causes the gates to which said transistor is connected to be reset to zero when it is triggered into conduction.

We shall now study the operation of the generator shown in FIG. 1, in which the point P of the reading device and the TMOS transistor $Q_1$ are connected to the gates $G_2$ and $G_4$. In the example under consideration, it is therefore assumed that samples $V_x$ are available and that it is desired to determine the coefficients $a_0 \ldots a_n$ by generating the voltages $V_R$ and $V_{Ri}$.

Five sequences can be distinguished in this operation:

Sequence $t_0$: a charge $2Q_R$ is introduced beneath the gate $G_e$ in a known manner and in accordance with the so-called "fill and spill" method. To this end, the diode $D_e$ is successively brought to a low level which permits transfer of charges from the diode $D_e$ beneath the gates $T_o$ and $G_e$, then to a high level which makes it possible to store a given quantity of charge $2Q_R$ beneath the gate $G_e$.

Figure 2A:
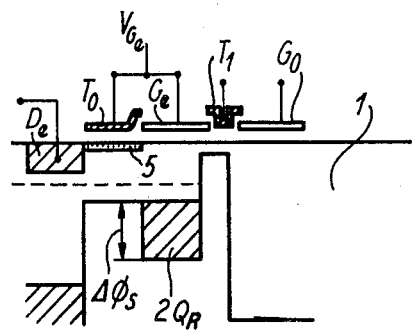
FIG. 2a is a sectional view of the charge-injection device of the generator in accordance with the invention and the surface potentials beneath said device at a given instant.

The gates $T_o$ and $G_e$ receive the same voltage $V_{GE}$ as shown in FIG. 2a which is a sectional view of the device for injection of charges, so as the surface potentials when the charge $2Q_R$ is stored beneath the gate $G_e$.

Figure 2B:
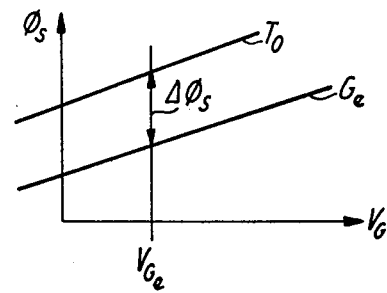
FIG. 2b shows the progressive variation in surface potential $\phi_S$ as a function of the voltage $V_G$ applied to two gates $T_o$ and $G_E$ of the injection device.

The reference quantity of charges $2Q_R$ has first-order stability or, in other words, is independent of the variations in voltage $V_{GE}$ applied to gates $T_o$ and $G_e$ if the surface potential curves as a function of the voltage of this pair of gates are parallel. To this end, the threshold voltages beneath the gates $T_o$ and $G_e$ are adjusted by means of an implantation 5 beneath the gate $T_o$ so as to ensure that the barrier height $\Delta Q_S$ has first-order independence with respect to $V_{GE}$. FIG. 2b shows the curves obtained in respect of the gates $T_o$ and $G_e$.

The other transfer electrodes of the generator (gates $T_1 \ldots T_6$) can be formed on an overthickness of oxide as shown in FIG. 2a in the case of the gate $T_1$. As in the case of the gate $T_o$, said transfer electrodes or gates may be formed by implantation or in any other known manner.

Sequence $t_1$: the charge $2Q_R$ is transferred beneath the gate $G_o$. The clock signal $\phi_2$ is at the high level $V_\phi$, with the result that the point B which was initially pre-loaded by transistor $Q_4$ at $V_{DD} - V_T$ changes to $V_B = V_{DD} - V_T + V_\phi$ and the point A changes to $V_B - V_T$, where $V_T$ is the threshold voltage which is common to the TMOS transistors $Q_2$, $Q_3$ and $Q_4$. The point P and the gates $G_2$ and $G_4$ are thus pre-loaded at $V_\phi - V_T$ and the TMOS transistor $Q_2$ is biased in the saturating mode since $V_{AO} = V_B - V_T > V_\phi - V_T$.

Sequence $t_2$: the charge $2Q_R$ which is present beneath the gate $G_o$ is transferred to the gates $G_1$ and $G_2$ by resetting the gate $G_o$ to zero since the gates $T_2$ and $T_3$ are at intermediate fixed potentials. The charges are therefore transferred over the potential barriers induced beneath $T_2$ and $T_3$, thereby eliminating the parasites which could arise from zero-resetting of the transfer gates $T_2$ and $T_3$ on the read gates $G_1$ and $G_2$.

The charge $Q_R$ is therefore available beneath the gate $G_1$ and the charge $Q_R$ is available beneath the gate $G_2$ on account of the charge distribution produced by the insulating diffusion.

During the same time interval, the gates $T_4$ and $G_3$ are reset to zero and the gate $T_5$ is reset at an intermediate fixed potential, which corresponds to transfer of any subsequent charge from the gate $G_3$ to the gate $G_4$.

During the first sequence $t_2$, there are no charges to be transferred from gate $G_3$ to gate $G_4$ and the arrival of $Q_R$ beneath gate $G_2$ alone causes current to flow through the transistor $Q_2$ which maintains the potential at the point P at $V_\phi - V_T$ whereas the potential at A changes from $V_{AO}$ to $V_A = V_{AO} - Q_R/C_A = V_{AO} - V_R$.

By means of the TMOS transistor $Q_5$ mounted as an emitter-follower, a voltage $V_S$ proportional to $V_R = Q_R/C_A$ is therefore available. The voltage $V_R$ is then compared in known manner with the sample $V_x$ to be coded and the value of $a_0$ is deduced therefrom:

$a_0 = 0$ if $V_x < V_R$ $a_0 = 1$ if $V_x > V_R$

Sequence $t_3$: depending on the value of $a_0$, the charge transfers are different:

if $a_0 = 0$, the charge $Q_R$ is transferred from the gate $G_1$ beneath the gate $G_o$ and then beneath the gate $G_e$ and is finally removed by the diode $D_e$;

if $a_0 = 1$, the charge $Q_R$ is transferred from gate $G_1$ beneath gate $G_3$. The charge $a_0 Q_R$ is therefore stored beneath gate $G_3$;

Sequence $t_4$: the transition of the clock signal $\phi_1$ to the high level whilst the clock signal $\phi_2$ shifts to the low level triggers the TMOS transistor $Q_1$ into conduction, initiates resetting of the gate $G_2$ to zero and therefore the transfer of $Q_R$ from gate $G_2$ to gate $G_o$ and resetting of gate $G_4$ to zero, and consequently the transfer of any subsequent charge from gate $G_4$ to gate $G_3$.

The different sequences are then resumed from the sequence $t_1$ but the sequence $t_0$ does not take place since the charge $Q_R$ is available beneath gate $G_o$.

We thus have successively:

sequence $t_1$: pre-loading of points A and P;

sequence $t_2$:

transfer of $Q_R/2$ beneath gate $G_2$ and of $Q_R/2$ beneath gate $G_1$;

transfer of $a_0 Q_R$ from gate $G_3$ to gate $G_4$;

reading of $a_0Q_R+Q_R/2$;

comparison of $V_{R1}=(a_0\cdot Q_R+Q_R/2)\cdot C_A$ with $V_x$ and determination of $a_1$.

sequence $t_3$:

if $a_1=0$, removal of $Q_R/2$ from gate $G_1$ to gates $G_2$, $G_e$ and diode $D_e$;

if $a_1=1$, transfer of $Q_R/2$ from gate $G_1$ beneath gate $G_3$.

sequence $t_4$:

transfer of $Q_R/2$ from gate $G_2$ to gate $G_o$;

transfer of $a_0Q_R$ from gate $G_4$ to gate $G_3$. The charge $a_0Q_R+a_1Q_R/2$ is accordingly present beneath gate $G_3$.

The different sequences are then resumed from $t_1$ until determination of $a_n$. For the determination of each coefficient $a_i$, it is therefore necessary to have a pre-load sequence $t_1$ and three successive transfer sequences $t_2$, $t_3$, $t_4$, a certain number of which therefore involve a plurality of simultaneous transfers.

For the determination of n coefficients, it is therefore necessary to have 4 n successive sequences, whereupon the generator is initialized for coding the following sample $V_x$. There then takes place a removal of $Q_R/2^n$ from gate $G_2$ to gates $G_o$ and $G_e$ and diode $D_e$ and for removal of the charges stored beneath gate $G_4$ to the diode $D_c$.

The surface area of the gates $G_1$ and $G_2$ is preferably equal to one-half of the area of gate $G_o$. Gates $G_3$ and $G_4$ preferably have a surface area equal to that of gate $G_o$. It is worthy of note that, when all the coefficients are equal to 1, the quantity of charges to be stored beneath gates $G_3$ and $G_4$ is close to $2Q_R$ since it is equal to $Q_{Rn}=2Q_R(1-\frac{1}{2}^n)$.

During the sequence $t_4$, the charge $Q_R/2^i$ is transferred from gate $G_2$ to gate $G_o$. Before said charge can again be transferred beneath the gates $G_1$ and $G_2$ in order to divide said charge by 2, it is essential to ensure that the charge has had time to be distributed beneath gate $G_o$ in a uniform manner. In actual fact, in order to obtain sufficient accuracy of charge distribution, the gate $G_o$ employed in practice is of relatively substantial width at right angles to the direction of charge transfer, said width being of the order of 300 $\mu$m, for example. The time of homogeneous distribution of a charge beneath an electrode of this width is of relatively long duration. In order to reduce this distribution time to an appreciable extent, a diffused region of the type opposite to that of the semiconductor substrate 1 is provided over the entire width of the electrode $G_o$.

Figure 3:
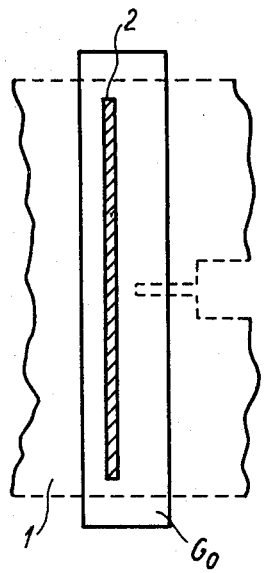
FIG. 3 is a diagram showing the diffused regions within the substrate beneath one of the gates $G_o$ of the charge-transfer device which constitutes the generator.

In FIG. 3, the reference numeral 2 designates the diffused region beneath the electrode $G_o$ which establishes high conduction from one end of the electrode to the other, thus facilitating transfer of charges and uniform distribution of these latter over the entire surface of said electrode $G_o$.

In order to dispense with the need for any external supply of reference voltage, the voltage $V_x$ to be coded can be converted to a quantity of charges $Q_x$ by means of an injection device which is identical with the device employed for generating $2Q_R$.

Figure 4:
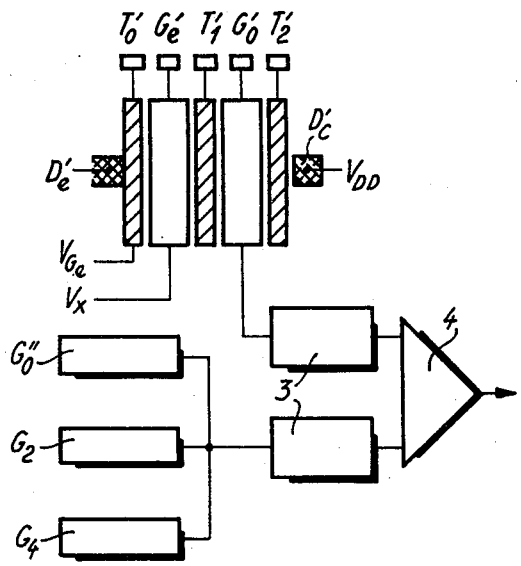
FIG. 4 is a diagram showing the arrangement of the generator in accordance with the invention when the voltage $V_x$ to be coded is converted to charges which are read before making a comparison with the voltages $V_{Ri}$.

This device is illustrated in FIG. 4 and comprises a diode $D_e'$ followed by a transfer gate $T_o'$ which is connected to $V_{Ge}$ and by a storage gate $G_e'$ which is connected to $V_x$.

Reading of $Q_x$ is then carried out on a storage gate $G_o'$ which is adjacent to the injection device by means of a readout device which is identical with the device employed for reading the charges beneath the gates $G_2$ and $G_4$. There is thus obtained a voltage $V_A'=-V_{AO}-Q_x/C_A$ to be compared with the voltage $V_{Ai}=-V_{AO}-Q_{Ri}/C_A$.

The advantage of conversion and then reading of $Q_x$ lies in the fact that the signals $V_A'$ and $V_{Ai}$ which are obtained are wholly comparable in regard to their direct-current component and their scale of amplitude.

Generation of $Q_x$ must be performed for determination of each coefficient $a_i$. Injection beneath the gate $G_e'$ takes place during the sequence $t_1$; transfer and readout beneath the gate $G_o'$ take place during the sequence $t_2$; removal beneath a diode $D_c'$ connected to $V_{DD}$ and separated from the gate $G_o'$ by a transfer gate $T_2'$ takes place during the sequence $t_3$. Provision must therefore be made for a voltage $V_x$ which is sampled and maintained.

The surface area of the storage gate $G_e'$ is preferably chosen so as to be identical with the area of the storage gate $G_e$. The maximum charge $2Q_R$ which can be processed by the generator is accordingly introduced beneath the gate $G_e'$ when $V_x$ is equal to $V_{GE}$.

In order to obtain a high degree of accuracy in respect of the minimum charge which can be injected beneath the gate $G_e'$ and subsequently read, a constant voltage $V_o$ is superimposed on the voltage $V_x$.

The voltage swing in the gate $G_e'$ accordingly takes place within the range of $V_o$ to $V_o+V_{GE}$. The quantities of charges beneath the gate $G_e'$ therefore vary between $Q_o$ and $Q_o+2Q_R$.

In order that a comparison between $V_A$, and $V_{Ai}$ may always be made, a quantity of charges $Q_o$ is added to the charges which arrive beneath gates $G_2$ and $G_4$. To this end, an additional storage gate $G_o''$ is connected to the point P as shown diagrammatically in FIG. 4. Accordingly, a quantity of charges $Q_o$ is injected and then transferred beneath the gate $G_o''$ by means of a device which is identical with the device employed for generating and transferring $Q_o+Q_x$. The quantities of charges $Q_o+Q_x$ and $Q_o+Q_{Ri}$ are read by readout devices 3 and a comparator 4 makes a comparison between the signals $$V_{A'}=V_{AO}-(Q_o+Q_x)/C_A$$

and $$V_{Ai}=V_{AO}-(Q_o+Q_{Ri})/C_A.$$

The devices for injection of $2Q_R$, $Q_x+Q_o$ and $Q_o$ must be sufficiently close together on the semiconductor substrate to prevent variations in technological parameters from one device to the next in regard to threshold voltage, oxide thickness and so on. Then these precautions have been taken, it is possible to avoid the use of an external reference-voltage supply.

Finally, when the voltage $V_x$ to be coded is negative, the comparison between $V_x$ and the voltages $V_R$, $V_{Ri}$ takes place after the voltage $V_x$ or the voltages $V_R$, $V_{Ri}$ have been reversed in sign by a differential stage.

We shall now study the operation of the generator in accordance with the invention when the point P of the readout device is connected only to the gate $G_4$ and when the TMOS transistor $Q_1$ is connected only to the gate $G_2$. This is therefore a case in which the coefficients $a_0 \ldots a_n$ are known and in which it is desired to generate $V_x$. A single charge readout is necessary in this case and is carried out by transfer from gate $G_3$ to gate $G_4$ whereas the quantity of charges $a_0Q_R+a_1Q_R/2+\ldots+a_nQ_R/2^n$ has been stored beneath gate $G_3$.

Consideration will be given hereinafter to the differences observed during the sequences $t_1$ to $t_4$ described earlier while noting that the sequence $t_o$ remains unchanged.

Sequence $t_1$: this is the sequence involving pre-loading of points A and P in order to permit reading of the charges. In this case, a single readout operation is performed when all the coefficients $a_o \ldots a_n$ have been processed. In contrast to the events which occurred in the previous instance, the sequence $t_1$ takes place only once for processing a series $a_o \ldots a_n$ as is the case with the sequence $t_o$. The period of the clock signal $\phi_2$ must therefore be modified;

Sequence $t_2$: the transfer of $Q_R$ and then $Q_R/2$, $Q_R/2^2 \ldots$ beneath gates $G_1$ and $G_2$ still takes place but is no longer followed each time by a transfer from gate $G_3$ to gate $G_4$, reading of charges beneath gates $G_2$ and $G_4$ and comparison of the readout voltage $V_{Ri}$ with $V_x$ in order to determine $a_i$. Transfer from gate $G_3$ to gate $G_4$ and reading beneath gate $G_4$ take place only once when all the values of the coefficients $a_i$ have been processed;

Sequence $t_3$: this sequence remains unmodified and removal of charges from gate $G_3$ to diode $D_e$ or transfer from gate $G_3$ to gate $G_4$ still takes place, depending on the value of $a_i$. The charge $a_oQ_R + a_1Q_R/2 + \ldots + a_iQ_R/2^i$ is therefore present beneath gate $G_3$;

Sequence $t_4$: the gate $G_2$ alone is reset to zero by the TMOS transistor $Q_1$.

It is readily apparent that the entire generator in accordance with the invention may be integrated on one and the same semiconductor substrate.

What is claimed is:

1. A charge-transfer coded-voltage generator for generating the voltages $$V_R, V_{Ri} = a_oV_R + a_1 \cdot V_R/2 + a_2 \cdot V_R/2^2 + \ldots + a_{i-1} \cdot V_R/2^{i-1} + V_R/2^i,$$

where $V_R$ is a reference voltage and where $i = 1 \ldots n$ and in which said voltages make it possible by comparison with a voltage $V_x$ to determine by successive approximations the coefficients $a_o \ldots a_n$ which are equal to 0 or to 1 and such that $V_x = a_oV_R + a_1 \cdot V_R/2 + a_2 \cdot V_R/2^2 \ldots + a_iV_R/2^i + \ldots + a_n \cdot V_R/2^n$ or alternatively for generating the voltage $V_x = a_oV_R + a_1 \cdot V_R/2 + a_2 \cdot V_R/2^2 + \ldots + a_i V_R/2^i + \ldots + a_n \cdot V_R/2^n$ in the event that the coefficients $a_o \ldots a_n$ are known, wherein said generator is constituted by a charge-transfer device comprising an alternate arrangement of storage gates and transfer gates together with:

a diode $D_e$ placed at one end of the active region in which transfer and storage of charges take place, the function of said diode being to inject a reference quantity of charges $2Q_R$ at the beginning of processing of each sample $V_x$ or of each series $a_o \ldots a_n$ as well as to effect removal of surplus charges during the processing operation;

an insulating diffusion which divides into two equal parts the charges originating from a storage gate $G_o$ located near the diode $D_e$ and which divides the active region into two parallel channels downstream of the gate $G_o$;

in one channel, a storage gate $G_2$ beneath which the quantities of charges $Q_R, Q_R/2 \ldots Q_R/2^i \ldots$ are stored by successive two-trip traversals between gates $G_o$ and $G_2$;

in the other channel, three storage gates $G_1$, $G_3$ and $G_4$, the quantity of charges $Q_R/2^i$ stored beneath gate $G_1$ and originating from gate $G_o$ being transferred beneath said gate $G_o$ and then removed beneath the diode $D_e$ when $a_i$ is zero in respect of $i = 0 \ldots n$ and being transferred beneath gate $G_3$ when $a_i$ is equal to 1;

when the coefficients $a_o \ldots a_n$ are unknown, a charge-reading device connected to gates $G_2$ and $G_4$ and adapted to generate the reference voltage $V_R$ at the time of transfer of the quantity of charges $Q_R$ beneath gate $G_2$, thus permitting determination of $a_o$ by comparison of the voltage $V_R$ with the voltage $V_x$, then to generate $V_{R1} = a_oV_R + V_R/2$ at the time of transfer of the quantity $Q_R/2$ beneath gate $G_2$ and, if $a_o = 1$, at the time of any subsequent transfer of $Q_R$ from gate $G_3$ to gate $G_4$, thus permitting determination of $a_1$ by comparison of the voltage $V_{R1}$ with the voltage $V_x$, and so on until generation of $V_{Rn}$ and determination of $a_n$ or, when the coefficients $a_o \ldots a_n$ are known, a charge-reading device connected to the gate $G_4$ for generating the voltage $V_x$ by transfer of charges from gate $G_3$ to gate $G_4$ when the n coefficients of $V_x$ have been processed.

2. A generator according to claim 1, wherein the surface area of the gates $G_1$ and $G_2$ is one-half of the area of gates $G_o$, $G_3$ and $G_4$.

3. A generator according to claim 1 wherein the two parallel channels have the same width.

4. A generator according to claim 1, wherein the diode $D_e$ is followed by a pair of gates consisting of a transfer electrode $T_o$ and a storage electrode $G_e$ to which the same voltage ($V_{GE}$) is applied, the implantation beneath the transfer electrode $T_o$ being adapted to ensure that the curves of surface potential as a function of the voltage of said pair of gates are parallel and the diode $D_e$ being successively brought to a low level which permits transfer of charges from the diode $D_e$ beneath the gates $T_o$ and $G_e$ then to a high level which permits storage of the quantity of charges $2Q_R$ beneath gate $G_e$.

5. A generator according to claim 1, wherein a diode ($D_c$) is provided in one of the channels downstream of the storage gate $G_4$ and permits removal of charges stored beneath gate $G_4$ on completion of the processing operation.

6. A generator according to claim 1, wherein the width of the storage gate $G_o$ at right angles to the direction of charge transfer is of sufficient value to permit division of charges stored beneath the gate $G_o$ into two equal parts with a high degree of accuracy and a diffused region of opposite type with respect to the substrate is provided over the entire width of the gate $G_o$ in order to reduce the time of distribution of charges beneath said gate $G_o$.

7. A generator according to claim 1, in which the voltage $V_x$ is available and the coefficients $a_o \ldots a_n$ are unknown, wherein said generator comprises an injection diode $D_e'$ which is identical with the diode $D_e$ and followed by a pair of gates consisting of a transfer electrode $T_o'$ and of a storage electrode $G_e'$ which is identical with the pair $T_o$-$G_e$, the diode $D_e'$ being successively brought to a low level and to a high level, the gate $T_o'$ being brought to the potential $V_{GE}$ and the potential $V_x$ being applied to the gate $G_e'$, the charges injected beneath gate $G_e'$ being read-out by a device which is identical with the device connected to gates $G_2$ and $G_4$, the result of said readout being compared with the readout performed beneath gates $G_2$ and $G_4$ for determination of the coefficients $a_o \ldots a_n$.

8. A generator according to claim 7, wherein the voltage $V_x$ applied to gate $G_e'$ varies between $V_o$ and $V_o + V_{Ge}$ and the quantity of charges injected beneath gate $G_e'$ varies between $Q_o$ and $Q_o + 2Q_R$, a quantity of charges equal to $Q_o$ being added to the charges which arrive beneath the gates $G_2$ and $G_4$ by means of a storage gate $G_o''$ which is connected to the point P and beneath which a quantity of charges $Q_o$ is injected by means of an injection device, said device being identical with the device which generates the quantities of charges $Q_o + Q_x$ and $2Q_R$.

9. A generator according to claim 7 wherein, the voltage $V_x$ being negative, said voltage $V_x$ or the voltages $V_R$, $V_{Ri}$ are reversed in sign by a differential stage before making a comparison between the voltages $V_x$ and $V_R$, $V_{Ri}$.

* * * * *